United States Patent
Zou et al.

(10) Patent No.: US 10,170,665 B2
(45) Date of Patent: Jan. 1, 2019

(54) REPAIRING METHOD, MANUFACTURING METHOD, DEVICE AND ELECTRONICS APPARATUS OF MICRO-LED

(71) Applicant: Goertek.Inc, Weifang, Shandong (CN)

(72) Inventors: Quanbo Zou, Weifang (CN); Zhe Wang, Weifang (CN)

(73) Assignee: Goertek.Inc, Weifang (CN)

( * ) Notice: Subject to any disclaimer, the term of this patent is extended or adjusted under 35 U.S.C. 154(b) by 0 days.

(21) Appl. No.: 15/559,778

(22) PCT Filed: Sep. 9, 2015

(86) PCT No.: PCT/CN2015/089276
§ 371 (c)(1),
(2) Date: Sep. 19, 2017

(87) PCT Pub. No.: WO2017/041253
PCT Pub. Date: Mar. 16, 2017

(65) Prior Publication Data
US 2018/0069148 A1    Mar. 8, 2018

(51) Int. Cl.
*H01L 21/00* (2006.01)
*H01L 33/00* (2010.01)
(Continued)

(52) U.S. Cl.
CPC .......... *H01L 33/0095* (2013.01); *H01L 24/03* (2013.01); *H01L 25/0753* (2013.01);
(Continued)

(58) Field of Classification Search
USPC ............................................................ 438/4
See application file for complete search history.

(56) References Cited

U.S. PATENT DOCUMENTS 8,518,204 B2 * 8/2013 Hu .................... H01L 24/83
156/249
2013/0210194 A1  8/2013 Bibl et al.
(Continued)

FOREIGN PATENT DOCUMENTS

| CN | 103972165 A | 8/2014 |
|---|---|---|
| CN | 105518888 A | 4/2016 |
| TW | 200421501 A | 10/2004 |

OTHER PUBLICATIONS

International Search Report dated Jun. 3, 2016 in International Patent Application No. PCT/CN2015/089276.
(Continued)

*Primary Examiner* — Timor Karimy
(74) *Attorney, Agent, or Firm* — Venable LLP; Michele V. Frank; Elizabeth C. G. Gitlin

(57) ABSTRACT

The present invention discloses a repairing method, manufacturing method, device and electronics apparatus of micro-LED. The method for repairing a micro-LED comprises: bringing a known-good micro-LED on a conductive pick-up head into contact with a first pad on an defective position of a receiving substrate, wherein the conductive pick-up head and the known-good micro-LED are bonded via a conductive adhesive; locally joule heating a first bonding layer through the conductive pick-up head, to melt the first bonding layer, wherein the first bonding layer is provided between the known-good micro-LED and the first pad; and lifting up the conductive pick-up head after the first bonding layer is cooled, leaving the known-good micro-LED on the receiving substrate.

11 Claims, 3 Drawing Sheets

(51) Int. Cl.
*H01L 33/62* (2010.01)
*H01L 23/00* (2006.01)
*H01L 25/13* (2006.01)
*H01L 33/48* (2010.01)
*H01L 25/075* (2006.01)

(52) U.S. Cl.
CPC ............ *H01L 25/13* (2013.01); *H01L 33/483* (2013.01); *H01L 33/62* (2013.01); *H01L 2224/83* (2013.01); *H01L 2224/98* (2013.01); *H01L 2924/0105* (2013.01); *H01L 2924/01079* (2013.01); *H01L 2933/0066* (2013.01)

(56) References Cited

U.S. PATENT DOCUMENTS

2014/0169924 A1* 6/2014 Golda ................. H01L 24/75
 414/752.1
2014/0267683 A1* 9/2014 Bibl ................. H01L 51/50
 348/87

OTHER PUBLICATIONS

Written Opinion dated Jun. 3, 2016 in International Patent Application No. PCT/CN2015/089276.

* cited by examiner

REPAIRING METHOD, MANUFACTURING METHOD, DEVICE AND ELECTRONICS APPARATUS OF MICRO-LED

This application is a national stage application, filed under 35 U.S.C. § 371, of International Application No. PCT/CN2015/089276, filed on Sep. 9, 2015, which is hereby incorporated by reference in its entirety.

FIELD OF THE INVENTION

The present invention relates to Micro-Light Emitting Diode (micro LED), and in particular, to a method for repairing a micro-LED, method for manufacturing a micro-LED device, a micro-LED device and an electronic apparatus.

BACKGROUND OF THE INVENTION

The micro-LED technology refers to the LED array of small size integrated on a substrate with high density. Currently, the micro-LED technology is starting development, and it is expected in the industry that a high-quality micro-LED product comes into the market. High-quality micro-LED will have a deep affection on the conventional display products such as LCD/OLED that have already been put into the market.

During the manufacturing of a micro-LED device, a defective micro-LED may be found on a receiving substrate after micro-LEDs are transferred to the receiving substrate. In this situation, a repair for the defect is required, which is called a micro-LED repair or repairing a micro-LED here. The receiving substrate is a display screen, for example.

In the prior art, the whole carrier substrate having known-good micro-LEDs thereon is heated to melt the solder on the carrier substrate. Then, a known-good micro-LED is picked up by using a pick-up head. Next, the known-good micro-LED is moved to a defective position of the receiving substrate by using the pick-up head. The known-good micro-LED is bonded onto the receiving substrate by heating the whole receiving substrate.

The U.S. Pat. No. 8,518,204 B2 discloses a method of fabricating and transferring a micro device and an array of micro device to a receiving substrate. This patent is wholly incorporated hereby as reference herein.

In the prior art, the carrier substrate and/or the receiving substrate shall be wholly heated, which will have influence on the performance of the micro-LED. Furthermore, the micro-LEDs that need a repair are generally a tiny portion of an array of micro-LEDs. Thus, the efficiency is low in the manner of wholly heating the carrier substrate and/or the receiving substrate.

SUMMARY OF THE INVENTION

One object of this invention is to provide a new technical solution for repairing a micro-LED.

According to a first aspect of the present invention, there is provided a method for repairing a micro-LED, comprising: bringing a known-good micro-LED on a conductive pick-up head into contact with a first pad on an defective position of a receiving substrate, wherein the conductive pick-up head and the known-good micro-LED are bonded via a conductive adhesive; locally joule heating a first bonding layer through the conductive pick-up head, to melt the first bonding layer, wherein the first bonding layer is provided between the known-good micro-LED and the first pad; and lifting up the conductive pick-up head after the first bonding layer is cooled, leaving the known-good micro-LED on the receiving substrate.

Preferably, the method further comprises: binging the conductive pick-up head into contact with the known-good micro-LED on a carrier substrate via the conductive adhesive; locally joule heating a second bonding layer though the conductive pick-up head, to melt the second bonding layer, wherein the second bonding layer is provided between the known-good micro-LED and the carrier substrate; and picking up the known-good micro-LED using the conductive pick-up head.

Preferably, the temperatures of the bonding layers are monitored through the I-V characteristics of the micro-LED, to determine whether the temperatures exceed the melting points of the bonding layers.

Preferably, the thermal conductivity of the material of the conductive pick-up head is lower than 100 W/m·K.

Preferably, the thermal conductivity of the material of the conductive pick-up head is lower than 30 W/m·K.

Preferably, the thermal conductivity of the material of the conductive pick-up head is lower than 1 W/m·K.

Preferably, the conductive pickup head is electrically connected from top to bottom by a vertical via hole.

Preferably, the melting points of the bonding layers are lower than 280° C.

Preferably, the first pad on the defective position is a redundant pad for repairing.

Preferably, the adhesion force of the conductive adhesive is larger than the surface tension when the bonding layers are melted and is lower than the bonding strength when the bonding layers are cooled.

Preferably, the thermal conductivity of the material of the carrier substrate is lower than 100 W/m·K.

According to a second aspect of the present invention, there is provided a method for manufacturing a micro-LED device, comprising repairing a micro-LED on a receiving substrate of the micro-LED device by using the method according to the present invention.

According to a first aspect of the present invention, there is provided a micro-LED device, which is manufactured by using the method according to the present invention.

According to a first aspect of the present invention, there is provided an electronic apparatus, containing a micro-LED device according to the present invention.

The inventors of the present invention have found that, in the prior art, the carrier substrate and/or the receiving substrate are wholly heated. However, the present invention locally heats a micro-LED through a conductive pick-up head. So, the task to be implemented by or the technical problem to be solved by the present invention has not been conceived or anticipated by a person skilled in the art and thus the present invention is a new solution.

Further features of the present invention and advantages thereof will become apparent from the following detailed description of exemplary embodiments according to the present invention with reference to the attached drawings.

BRIEF DESCRIPTION OF THE DRAWINGS

The accompanying drawings, which are incorporated in and constitute a part of the specification, illustrate embodiments of the invention and, together with the description thereof, serve to explain the principles of the invention.

DETAILED DESCRIPTION OF THE EMBODIMENTS

Figure 1:
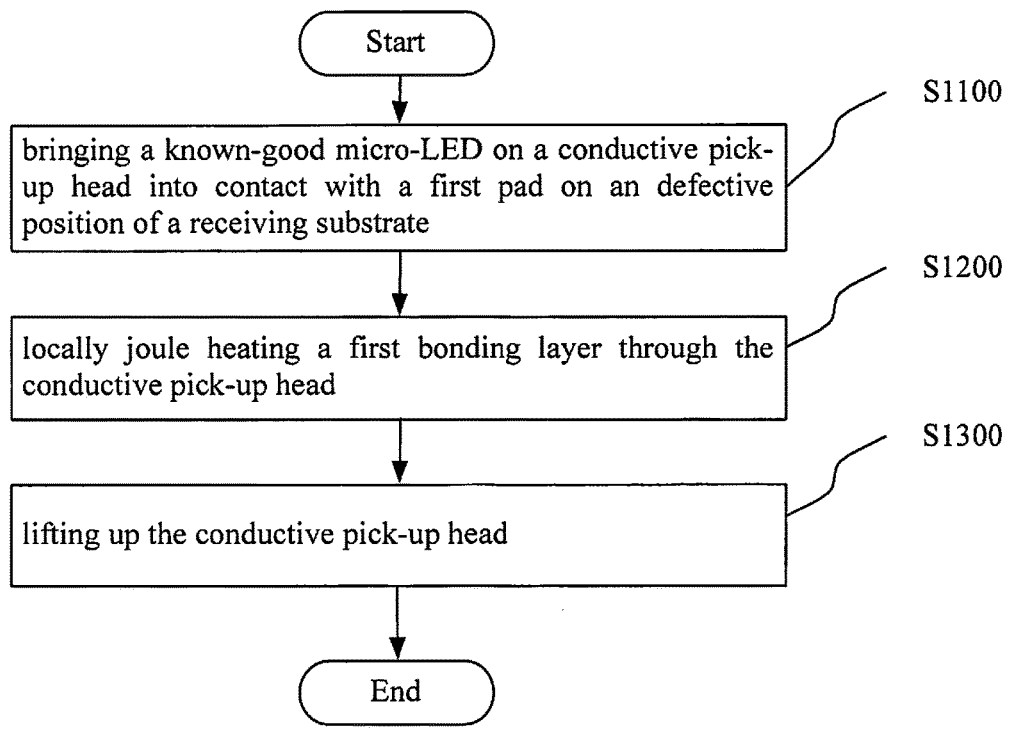
FIG. 1 is a flow chart of a method for repairing a micro-LED according to an embodiment of the present invention.

Various exemplary embodiments of the present invention will now be described in detail with reference to the drawings. It should be noted that the relative arrangement of the components and steps, the numerical expressions, and numerical values set forth in these embodiments do not limit the scope of the present invention unless it is specifically stated otherwise.

The following description of at least one exemplary embodiment is merely illustrative in nature and is in no way intended to limit the invention, its application, or uses.

Techniques, methods and apparatus as known by one of ordinary skill in the relevant art may not be discussed in detail but are intended to be part of the specification where appropriate.

In all of the examples illustrated and discussed herein, any specific values should be interpreted to be illustrative only and non-limiting. Thus, other examples of the exemplary embodiments could have different values.

Notice that similar reference numerals and letters refer to similar items in the following figures, and thus once an item is defined in one figure, it is possible that it need not be further discussed for following figures.

The embodiments and examples of the present invention will be described in detail with reference to the drawings.

FIG. 1 shows a flow chart of a method for repairing a micro-LED according to an embodiment of the present invention.

As shown in FIG. 1, at step S1100, a known-good micro-LED on a conductive pick-up head is brought into contact with a first pad on an defective position of a receiving substrate. The conductive pick-up head can be pressed down so that the contact between the known-good micro-LED and the first pad is more sufficient. The conductive pick-up head and the known-good micro-LED can be bonded via a conductive adhesive. The first pad on the defective position can be a redundant pad for repairing.

The known-good micro-LED can be arranged on the conductive pick-up head through various manners. For example, the conductive pick-up head can pick up a known-good micro-LED from a carrier substrate. The pick-up can be performed using the prior art manner.

Alternatively, in an example, the conductive pick-up head is brought into contact with the known-good micro-LED on a carrier substrate via the conductive adhesive. Then, a second bonding layer is locally joule heating though the conductive pick-up head, to melt the second bonding layer, and the known-good micro-LED is picked up using the conductive pick-up head. The second bonding layer is provided between the known-good micro-LED and the carrier substrate. It shall be understood by a person skilled in the art that the bonding layer is conductive and a conductive loop can be formed through the bonding layer and the conductive pick-up head to performing the local joule heating.

The temperature of the second bonding layer can be monitored through the I-V characteristics of the micro-LED, to determine whether the temperatures exceed the melting point of the bonding layer. For example, the second bonding layer has a relatively low melting point, for example, lower than 280° C. (the melting point of Au—Sn eutectic alloy, for example), preferably lower than 232° C. (the melting point of Sn 232'C, for example), and more preferably, lower than 200° C. (the melting point of In is 157° C., for example). It should be understood by a person skilled in the art that the adhesion force of the conductive adhesive shall be larger than the surface tension when the second bonding layers are melted.

For example, the material of the carrier substrate can be a material with a relatively low thermal conductivity, such as plastic, glass, quartz and so on. For example, its thermal conductivity is lower than 100 W/m·K; preferably, lower than 30 W/m·K; and more preferably, lower than 1 W/m·K. The influence on the other micro-LEDs during the picking up can be reduced by using the material with a relatively small thermal conductivity.

At step S1200, a first bonding layer is locally joule heated through the conductive pick-up head, to melt the first bonding layer. The first bonding layer is provided between the known-good micro-LED and the first pad. It should be understood by a person skilled in the art that a conductive loop can be formed by the bonding layer such solder or the pad and the conductive pick-up head, to perform a local joule heating.

For example, the material of the conductive pick-up head can be a material with a relatively low thermal conductivity, so that the efficiency can be improved during the heating. For example, its thermal conductivity is lower than 100 W/m·K; preferably, lower than 30 W/m·K; and more preferably, lower than 1 W/m·K.

For example, the pick-up head can be formed by using a PCT plate. The conductive pickup head can be electrically connected from top to bottom by a vertical via hole.

The temperature of the first bonding layer can be monitored through the I-V characteristics of the micro-LED, to determine whether the temperatures exceed the melting points of the bonding layers. For example, the first bonding has a relatively low melting point, for example, lower than 280° C. (the melting point of Au—Sn eutectic alloy, for example), preferably lower than 232° C. (the melting point of Sn 232'C, for example), and more preferably, lower than 200° C. (the melting point of In is 157° C., for example).

At step S1300, the conductive pick-up head is picked up after the first bonding layer is cooled, leaving the known-good micro-LED on the receiving substrate. For example, the cooling can be a complete cooling and a partial cooling.

It should be understood by a person skilled in the art that the adhesion force of the conductive adhesive is larger than the surface tension when the first bonding layer is melted and is lower than the bonding strength when the first bonding layers is cooled.

In the solution of the present invention, a local joule heating is performed by using a conductive pick-up head, so that just the local bonding layer can be melted. The influence on the other micro-LEDs on the carrier substrate and/or the receiving substrate can be lowered through the technical solution of the present invention.

Furthermore, the melting state of a bonding layer can be determined in a relatively accurate manner by monitoring the temperature of the bonding layer through I-V characteristics. Accordingly, the energy used can be lowered. Furthermore, the influence on the picked-up micro-LED and/or the other micro-LEDs can be lowered.

According to another embodiment of the present invention, there is further provided a method for manufacturing a micro-LED device. The manufacturing method comprises repairing a micro-LED on a receiving substrate of the micro-LED device by using the method according to the present invention. For example, the receiving substrate is a display screen or display substrate. The micro-LED device is a display device, for example.

In another embodiment, the present invention further provides a micro-LED device, such as a display device. The micro-LED device can be manufactured by using the method for manufacturing a micro-LED device according to the present invention.

In another embodiment, the present invention further provides an electronic apparatus. The electronic apparatus contains a micro-LED device according to the present invention. For example, the electronic apparatus can be a mobile phone, a pad and so on.

Below, an example according to the present invention will be described with reference to FIGS. 2-7.

Figure 2:
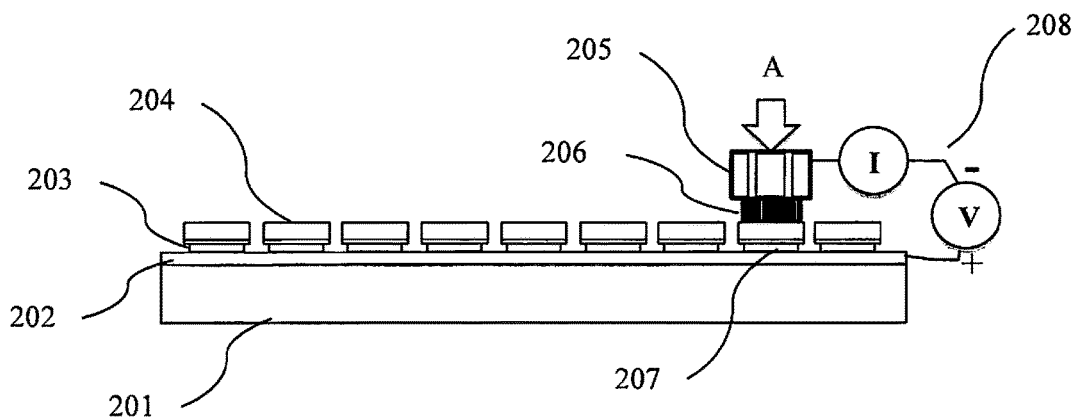
FIG. 2 to FIG. 5 are schematic diagrams of an example for repairing a micro-LED according to the present invention.

FIG. 2 shows a carrier substrate 201, a bonding layer 202 and known-good micro-LEDs 204. The carrier substrate 201 has low thermal conductivity, for example. The material of the carrier substrate is plastic, glass or quartz, etc., for example. The bonding layer 202 is solder, metal, alloy and so on, for example. For example, the bonding layer has a relatively low melting point, for example, lower than 280° C. The p-metal electrodes 203 of the known-good micro-LEDs are bonded with the bonding layer.

As shown in FIG. 2, the pick-up head 205 is pressed down in the direction as shown by the arrow A, to get in contact with a known-good micro-LED via a conductive adhesive 206. A conductive loop is formed via the pick-up head 205 and the bonding layer. A current is applied in the loop, as shown by 208. For example, the temperature rises at the position indicated by 207.

Figure 6:
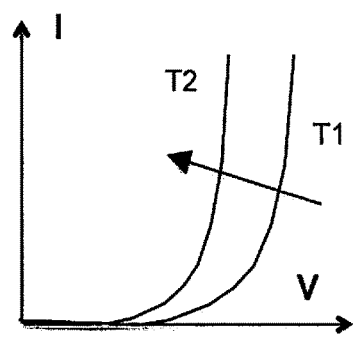
FIG. 6 is a schematic diagram illustratively showing an I-V graph of a micro-LED.

The temperature is monitored through the I-V characteristics in the loop (the I-V characteristics of the micro-LED). Generally, the temperature of a micro-LED can be determined in a accurate manner through detection of the current and/or voltage of a micro-LED. FIG. 6 schematically shows a relationship between I-V curves and temperature. Here, monitoring temperature through I-V characteristics includes monitoring temperature through detection of current and/or voltage.

Figure 3:
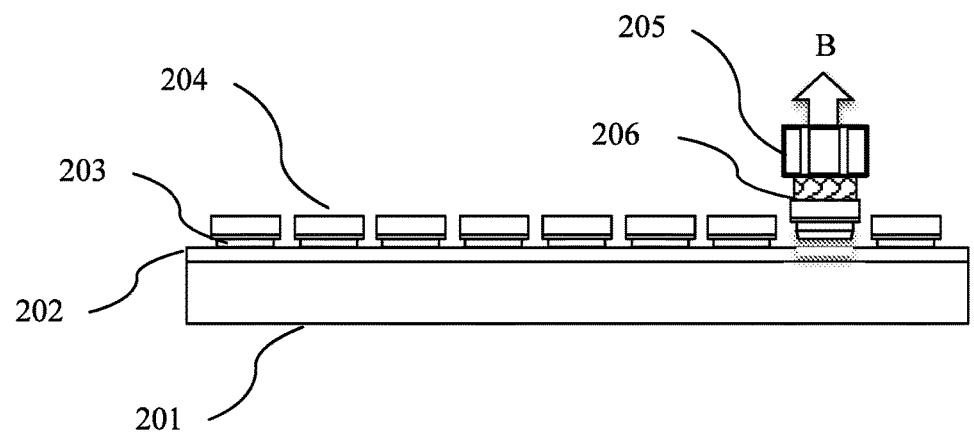

As shown in FIG. 3, when the temperature exceeds the melting point of the bond layer, the pick-up head 205 is lifted up in a direction of the arrow B, to lift of the known-good micro-LED from the carrier substrate 201.

Figure 4:
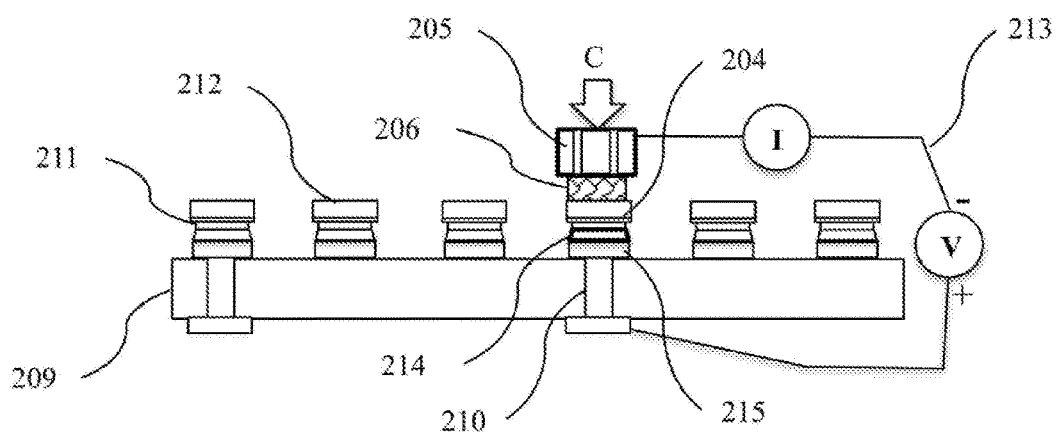

As shown in FIG. 4, the pick-up head 205 is moved to a defective position of a receiving substrate 209. The known-good micro-LED 204 on the pick-up head 205 is brought into contact with a pad 215 on the receiving substrate 209 via a bonding layer 214. In FIG. 4, the p-metal electrode 211 of the micro-LEDs 212 are bonded with pads on the receiving substrate 209. The pick-up head 205 is pressed down in a direction of the arrow C, so that the known-good micro-LED 204 is sufficiently brought into contact with the pad 215.

A loop is formed by the pick-up head 205 and the lead 210 (and pad). As indicated in by 213, a current is applied into the loop, to perform a local joule heating. The temperature is monitored by the I-V characteristics in the loop, i.e. the I-V characteristics of the micro-LED.

Figure 5:
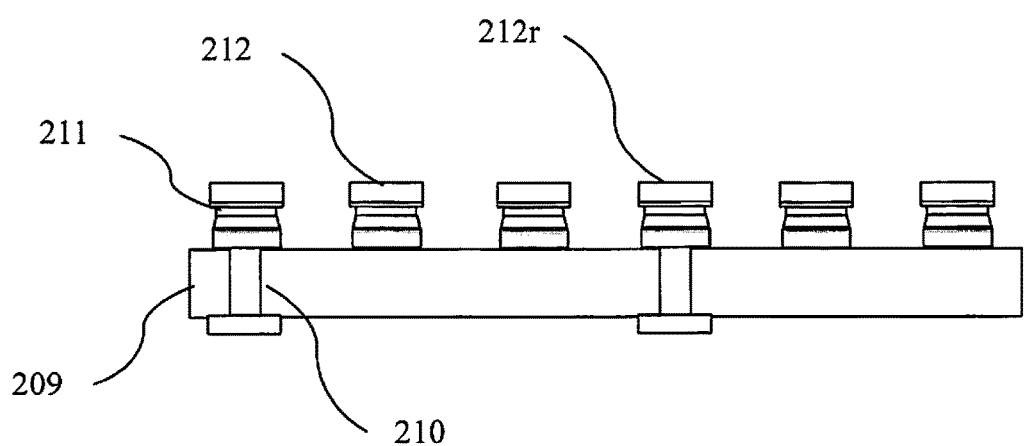

When the temperature exceeds the melting point, the pick-up head 205 is lifted up and is moved away. As shown in FIG. 5, the repaired known-good micro-LED 212r is left on the receiving substrate 209.

Although some specific embodiments of the present invention have been demonstrated in detail with examples, it should be understood by a person skilled in the art that the above examples are only intended to be illustrative but not to limit the scope of the present invention. It should be understood by a person skilled in the art that the above embodiments can be modified without departing from the scope and spirit of the present invention. The scope of the present invention is defined by the attached claims.

What is claimed is:

1. A method for repairing a micro-LED, comprising:
binging a conductive pick-up head into contact with a known-good micro-LED on a carrier substrate via a conductive adhesive;
locally joule heating a second bonding layer through the conductive pick-up head, to melt the second bonding layer, wherein the second bonding layer is provided between the known-good micro-LED and the carrier substrate; and
picking up the known-good micro-LED using the conductive pick-up head;
bringing the known-good micro-LED on the conductive pick-up head into contact with a first pad on an defective position of a receiving substrate, wherein the conductive pick-up head and the known-good micro-LED are bonded via the conductive adhesive;
locally joule heating a first bonding layer through the conductive pick-up head, to melt the first bonding layer, wherein the first bonding layer is provided between the known-good micro-LED and the first pad; and
lifting up the conductive pick-up head after the first bonding layer is cooled, leaving the known-good micro-LED on the receiving substrate,
wherein the adhesion force of the conductive adhesive is larger than the surface tension when the bonding layers are melted and is lower than the bonding strength when the bonding layers are cooled.

2. The method according to claim 1, wherein the temperatures of the bonding layers are monitored through the I-V characteristics of the micro-LED, to determine whether the temperatures exceed the melting points of the bonding layers.

3. The method according to claim 1, wherein the thermal conductivity of the material of the conductive pick-up head is lower than 100 W/m·K.

4. The method according to claim 3, wherein the thermal conductivity of the material of the conductive pick-up head is lower than 30 W/m·K.

5. The method according to claim 4, wherein the thermal conductivity of the material of the conductive pick-up head is lower than 1 W/m·K.

6. The method according to claim 1, wherein the conductive pickup head is electrically connected from top to bottom by a vertical via hole.

7. The method according to claim 1, wherein the melting points of the bonding layers are lower than 280° C.

8. The method according to claim 1, wherein the first pad on the defective position is a redundant pad for repairing.

9. The method according to claim 1, wherein the thermal conductivity of the material of the carrier substrate is lower than 100 W/m·K.

10. A method for manufacturing a micro-LED device, comprising repairing a micro-LED on a receiving substrate of the micro-LED device by using the method according to claim 1.

11. A micro-LED device, which is manufactured by using the method according to claim 10.

* * * * *